United States Patent
Tsuji et al.

(10) Patent No.: US 9,799,732 B2
(45) Date of Patent: Oct. 24, 2017

(54) SILICON CARBIDE SEMICONDUCTOR DEVICE AND FABRICATION METHOD OF SILICON CARBIDE SEMICONDUCTOR DEVICE

(71) Applicant: FUJI ELECTRIC CO., LTD., Kawasaki-shi, Kanagawa (JP)

(72) Inventors: Takashi Tsuji, Tsukuba (JP); Noriyuki Iwamuro, Tsukuba (JP); Kenji Fukuda, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/404,771

(22) PCT Filed: Mar. 18, 2013

(86) PCT No.: PCT/JP2013/057748
§ 371 (c)(1),
(2) Date: Dec. 1, 2014

(87) PCT Pub. No.: WO2013/179729
PCT Pub. Date: Dec. 5, 2013

(65) Prior Publication Data
US 2015/0115287 A1 Apr. 30, 2015

(30) Foreign Application Priority Data
May 31, 2012 (JP) .................................. 2012-125255

(51) Int. Cl.
*H01L 29/66* (2006.01)
*H01L 29/16* (2006.01)
(Continued)

(52) U.S. Cl.
CPC .... *H01L 29/1608* (2013.01); *H01L 21/02529* (2013.01); *H01L 24/05* (2013.01);
(Continued)

(58) Field of Classification Search
CPC ......... H01L 21/04; H01L 29/06; H01L 29/24; H01L 29/1608; H01L 29/872;
(Continued)

(56) References Cited

U.S. PATENT DOCUMENTS 5,914,500 A 6/1999 Bakowski et al.
6,002,159 A 12/1999 Bakowski et al.
(Continued)

FOREIGN PATENT DOCUMENTS

JP 9-162422 A 6/1997
JP 2001-508950 A 7/2001
(Continued)

OTHER PUBLICATIONS

Notification of Transmittal of Translation of The International Preliminary Report on Patentability (Form PCT/IB/338) of International Application No. PCT/JP2013/057748 dated Dec. 11, 2014 with Forms PCT/IB/373, PCT/ISA/237 and PCT/IB/326 (10 pages).
(Continued)

*Primary Examiner* — Fazli Erdem
(74) *Attorney, Agent, or Firm* — Westerman, Hattori, Daniels & Adrian, LLP

(57) ABSTRACT

A $P^+$ type region, a p-type region, and a $P^-$ type region are disposed in a surface layer of a silicon carbide substrate base and are disposed in a breakdown voltage structure portion surrounding an active region to make up an element structure of Schottky junction. The $p^-$ type region surrounds the $P^+$ type region and the p-type region to form a junction termination structure. A Schottky electrode forms a Schottky junction with an n-type silicon carbide epitaxial layer. The Schottky electrode and an electrode pad have end portions positioned on the $P^+$ type region and the end portion of the Schottky electrode is exposed from the end portion of the electrode pad. As a result, the region of the breakdown voltage structure portion can be made smaller while the active region can be made larger, and a semiconductor device is easily fabricated.

2 Claims, 1 Drawing Sheet

(51) Int. Cl.
H01L 29/872 (2006.01)
H01L 21/02 (2006.01)
H01L 23/00 (2006.01)
H01L 29/417 (2006.01)
H01L 29/06 (2006.01)

(52) U.S. Cl.
CPC ...... H01L 29/66143 (2013.01); H01L 29/872 (2013.01); *H01L 29/0615* (2013.01); *H01L 29/417* (2013.01); *H01L 2924/13055* (2013.01); *H01L 2924/13091* (2013.01)

(58) Field of Classification Search
CPC ... H01L 21/76; H01L 21/76224; H01L 23/52; H01L 23/5227; H01L 28/10; H01L 21/02529; H01L 24/05; H01L 29/16; H01L 29/66; H01L 29/66143
See application file for complete search history.

(56) References Cited

U.S. PATENT DOCUMENTS

| | | | | |
|---|---|---|---|---|
| 2003/0006471 | A1* | 1/2003 | Satoh | H01L 23/051 257/471 |
| 2004/0212011 | A1* | 10/2004 | Ryu | H01L 29/872 257/335 |
| 2006/0118812 | A1* | 6/2006 | Ohtsuka | H01L 29/0619 257/107 |
| 2007/0096239 | A1* | 5/2007 | Cao | H01L 29/66196 257/458 |
| 2009/0008651 | A1* | 1/2009 | Okuno | H01L 29/872 257/77 |
| 2011/0147880 | A1* | 6/2011 | Matthias | H01L 29/0619 257/504 |
| 2011/0195563 | A1* | 8/2011 | Okuno | H01L 21/0465 438/518 |
| 2011/0215338 | A1* | 9/2011 | Zhang | H01L 29/1608 257/73 |
| 2012/0146055 | A1* | 6/2012 | Mitani | H01L 29/0619 257/77 |
| 2012/0302051 | A1* | 11/2012 | Matsuno | H01L 29/1608 438/571 |

FOREIGN PATENT DOCUMENTS

| | | |
|---|---|---|
| JP | 2008-34646 A | 2/2008 |
| JP | 2009-44177 A | 2/2009 |
| JP | 2010-4065 A | 1/2010 |
| JP | 2010-50147 A | 3/2010 |
| JP | 2011-165856 A | 8/2011 |
| JP | 2011-216816 A | 10/2011 |
| JP | 2012-69567 A | 4/2012 |

OTHER PUBLICATIONS

International Search Report dated May 14, 2013, issued in corresponding application No. PCT/JP2013/057748.
Ivanov et al., "Breakdown Behavior of 900-V 4H-SiC Schottky Barrier Diodes Terminated with Boron-Implanted pn-Junction", Materials Science Forum, 2009, vols. 600-603, pp. 955-958, cited in Japanese Information Statement dated Aug. 7, 2015 (3 pages).
Vassilevski et al., "4.6 kV, 10.5 mOhm-cm2 Nickel Silicide Schottky Diodes on Commercial 4H-SiC Epitaxial Wafers", Materials Science Forum, 2010, vols. 645-648, pp. 897-900, cited in Japanese Information Statement dated Aug. 7, 2015 (4 pages).
Treu et al., "A Surge Current Stable and Avalanche Rugged SiC Merged pn Schottky Diode Blocking 600V Especially Suited for PFC Applications", Materials Science Forum, 2006, vols. 527-529, pp. 1155-1158, cited in Japanese Information Statement dated Aug. 7, 2015 (3 pages).
Kuroda et al., Distribution of Forward Voltage of SiC Schottky Barrier Diode Using Ti Sintering Process, Materials Science Forum, 2009, vols. 600-603, pp. 979-982, cited in Japanese Information Statement dated Aug. 7, 2015 (3 pages).
Brylinski et al., "Active Devices for Power Electronics : SiC vs III-N compounds The case of Schottky Rectifiers", Materials Science Forum, 2010, vols. 645-648, pp. 879-884, cited in Japanese Information Statement dated Aug. 7, 2015 (6 pages).
Information Statement dated Aug. 7, 2015, issued in counterpart Japanese Patent Application No. 2012-125255, w/ partial English translation (32 pages).
Office Action dated Oct. 18, 2016, issued in counterpart Japanese Application No. 2012-125255, with partial English translation. (17 pages).
Office Action dated Jul. 19, 2016, issued in counterpart Japanese Patent Application No. 2012-125255 w/ partial English translation (27 pages).

* cited by examiner

SILICON CARBIDE SEMICONDUCTOR DEVICE AND FABRICATION METHOD OF SILICON CARBIDE SEMICONDUCTOR DEVICE

TECHNICAL FIELD

The present invention relates to a silicon carbide semiconductor device and a fabrication method of the silicon carbide semiconductor device.

BACKGROUND ART

Silicon (Si) is conventionally used as constituent material for power semiconductor devices controlling high voltage and large current. The power semiconductor devices fall into several types, such as bipolar transistors, insulated gate bipolar transistors (IGBTs), and insulated gate field-effect transistors (MOSFET), and are selectively used according to the intended purpose.

For example, bipolar transistors and IGBTs cannot be switched at high speed although higher current density enables larger current as compared to MOSFETs. For example, the use of bipolar transistors is limited up to a switching frequency of several kHz and the use of IGBTs is limited up to a switching frequency of tens of kHz. On the other hand, power MOSFETs can perform high-speed switching operation up to several MHz, although lower current density makes it difficult to handle larger current as compared to bipolar transistors and IGBTs.

However, since a power semiconductor device supporting both large current and high-speed performance is strongly demanded in the market, efforts are made to improve IGBTs and power MOSFETs, which have been developed substantially to the theoretical limits determined by the materials. Semiconductor materials replacing silicon are studied in terms of power semiconductor devices and silicon carbide (SiC) is attracting attention as a semiconductor material usable for producing (fabricating) a next generation power semiconductor device excellent in low ON-voltage, high-speed characteristics, and high-temperature characteristics.

Chemically, silicon carbide is very stable semiconductor material with a wide band gap of 3 eV and can be used extremely stably as a semiconductor even at high temperatures. Silicon carbide has critical electric field that is 10-fold or greater than silicon and therefore, is expected as a semiconductor material capable of making ON-resistance sufficiently small. Such features of silicon carbide are the same as those of other wide band gap semiconductors, for example, gallium nitride (GaN). Therefore, by using wide band gap semiconductors, a higher breakdown voltage of a semiconductor device can be achieved.

However, in a high-voltage semiconductor device, high voltage is applied not only to an active region in which an element structure is formed, but also to a breakdown voltage structure portion disposed in a peripheral portion of the active region to retain a breakdown voltage, and an electric field concentrates on the breakdown voltage structure portion. The breakdown voltage of a high-voltage semiconductor device is determined by the impurity concentration, thickness, and field intensity of the semiconductor, and the withstanding capability is determined by semiconductor-specific features, and in this way, is equal across the active region and the breakdown voltage structure portion. Therefore, when the electric field concentrates on the breakdown voltage structure portion, an electric load exceeding the withstanding capability may be applied to the breakdown voltage structure portion and may cause destruction.

A semiconductor device having a breakdown voltage structure portion provided with a termination structure such as a junction termination extension (JTE) structure and a field limiting ring (FLR) structure is known as a device having a breakdown voltage of the entire high-voltage semiconductor device improved by alleviating or dispersing the electric field of the breakdown voltage structure portion. In a known semiconductor device, a floating metal electrode in contact with the FLR is disposed as a field plate (FP) to release electric charge generated in the breakdown voltage structure portion for improvement in reliability (see, e.g., Patent Document 1).

FIG. 2 is a cross-sectional view of a Schottky barrier diode (SBD) of a conventional technique. A Schottky electrode 17 and an electrode pad 18 are disposed on a silicon carbide substrate 12 and an active portion is formed while a breakdown voltage structure portion (edge portion) is formed from a ring-shaped p-type region 15 to surround the active portion, thereby retaining a breakdown voltage. The p-type region 15 is made up of a $p^+$ type region 15a disposed at the termination end of the Schottky electrode 17, a p-type region 15b adjacent to the outer periphery of the $p^+$ type region 15a, and a $p^-$ type region 15c adjacent to the outer periphery of the p-type region 15b. Reference numeral 16 denotes an interlayer insulation film made of oxide silicon ($SiO_2$), etc.

The electrode pad 18 is made of aluminum-silicon (Al—Si) based alloy, for example, and has a thickness of about 5 μm. The electrode pad 18 has such a predetermined thickness for impact absorption at the time of ultrasonic bonding using wire bonding of Al etc.

Fabrication steps of the electrode pad 18 and the Schottky electrode 17 will be described as follows:
1. deposition of Ti by sputtering;
2. resist patterning through resist application and photolithography;
3. wet etching of Ti with ammonia hydrogen peroxide water to form the Schottky electrode 17;
4. deposition of Al—Si by sputtering;
5. resist patterning through resist application and photolithography; and
6. wet etching of Al—Si with phosphoric/nitric/acetic-acid mixture liquid to cover the Schottky electrode 17. In this case, Ti is not wet-etched by the mixture liquid. Subsequently, to remove remaining Si (called nodules), dry etching (particle etching) is performed by using carbon tetrafluoride and oxygen as source gas to form the electrode pad 18.

Patent Document 1: Japanese Laid-Open Patent Publication No. 2010-50147

DISCLOSURE OF INVENTION

Problem to be Solved by the Invention

Nonetheless, since the electrode pad 18 is as thick as 5 μm, an etching amount varies in a transverse (width) direction at the time of the wet etching described above. Due to this variation, a position of an end surface 18a of the electrode pad 18 ranges about 10 to 15 μm in a transverse direction. In the fabrication steps, both the Schottky electrode 17 and the electrode pad 18 must be designed to have end portions positioned within the $p^+$ type region 15a. This is because if the end portions of the Schottky electrode 17 and the electrode pad 18 reach a position within the p-type region 15b, a field plate (FP) structure is formed and the interlayer insulation film 16 is destroyed.

Therefore, the width of the p⁺ type region 15a is conventionally made larger so as to absorb the variation of wet etching to the electrode pad 18. For example, to accommodate the variation, the p⁺ type region 15a must be greater than or equal to 20 µm. As a result, the width of the breakdown voltage structure portion (edge portion) becomes larger and a die size is increased, resulting in high cost.

It is an object of the present invention to provide a silicon carbide semiconductor device and a fabrication method of a silicon carbide semiconductor device capable of making a region of a breakdown voltage structure portion smaller and an active region larger and easily fabricated so as to eliminate the problems of the conventional technique described above.

Means for Solving Problem

To solve the problems described above and achieve an object of the present invention, a silicon carbide semiconductor device according to the present invention has the following characteristics. On a surface of a first-conductivity-type wide band gap semiconductor substrate, a first-conductivity-type wide band gap semiconductor deposition layer is deposited with an impurity concentration lower than the first-conductivity-type wide band gap semiconductor substrate. An element structure is included that is made up by forming a first metal film forming Schottky junction with the first-conductivity-type wide band gap semiconductor deposition layer. A second metal film for an electrode is formed on the first metal film, and a first second-conductivity-type semiconductor region surrounding a peripheral portion of the element structure is selectively disposed in a surface layer of the first-conductivity-type wide band gap semiconductor deposition layer on the side opposite to the first-conductivity-type wide band gap semiconductor substrate. A second second-conductivity-type semiconductor region is included that surrounds a peripheral portion of the first second-conductivity-type semiconductor region to make up a junction termination structure. End portions of the first metal film and the second metal film are positioned on the first second-conductivity-type semiconductor region with the end portion of the first metal film exposed from the end portion of the second metal film.

A fabrication method of a silicon carbide semiconductor device according to the present invention has the following characteristics. The method includes depositing on a surface of a first-conductivity-type wide band gap semiconductor substrate, a first-conductivity-type wide band gap semiconductor deposition layer with an impurity concentration lower than the first-conductivity-type wide band gap semiconductor substrate. The method includes subsequently forming an element structure by forming a first metal film forming Schottky junction with the first-conductivity-type wide band gap semiconductor deposition layer, and forming a second metal film for an electrode on the first metal film. The method further includes selectively forming a first second-conductivity-type semiconductor region in a surface layer of the first-conductivity-type wide band gap semiconductor deposition layer to surround a peripheral portion of the element structure, and selectively forming a second second-conductivity-type semiconductor region having an impurity concentration lower than the first second-conductivity-type semiconductor region in a surface layer of the first-conductivity-type wide band gap semiconductor deposition layer, the second second-conductivity-type semiconductor region surrounding a peripheral portion of the first second-conductivity-type semiconductor region to make up a junction termination structure. End portions of the first metal film and the second metal film are positioned on the first second-conductivity-type semiconductor region with the end portion of the first metal film exposed from the end portion of the second metal film.

According to the invention described above, since the electrode pad having a predetermined thickness is disposed inside (closer to the active region) with respect to the Schottky electrode and the end portion of the Schottky electrode is exposed from the end portion of the electrode pad, both the Schottky electrode and the electrode pad can easily be fabricated at positions on the p⁺ type region for the JTE structure. Since the p⁺ type region of the breakdown voltage structure portion has a smaller width, the die size is not increased.

Effect of the Invention

The silicon carbide semiconductor device and the fabrication method of a silicon carbide semiconductor device according to the present invention produce an effect that the region of the breakdown voltage structure portion can be made smaller while the active region can be made larger and that the silicon carbide semiconductor device is easily fabricated.

BEST MODE(S) FOR CARRYING OUT THE INVENTION

Preferred embodiments of a silicon carbide semiconductor device and a fabrication method of a silicon carbide semiconductor device according to the present invention will be described in detail with reference to the accompanying drawings. In this description and the accompanying drawings, layers and regions prefixed with n or p mean that majority carriers are electrons or holes, respectively. Additionally, + and − added to n or p mean that the impurity concentration is higher and lower, respectively, than layers and regions without + and −.

(Embodiment)

Figure 1:
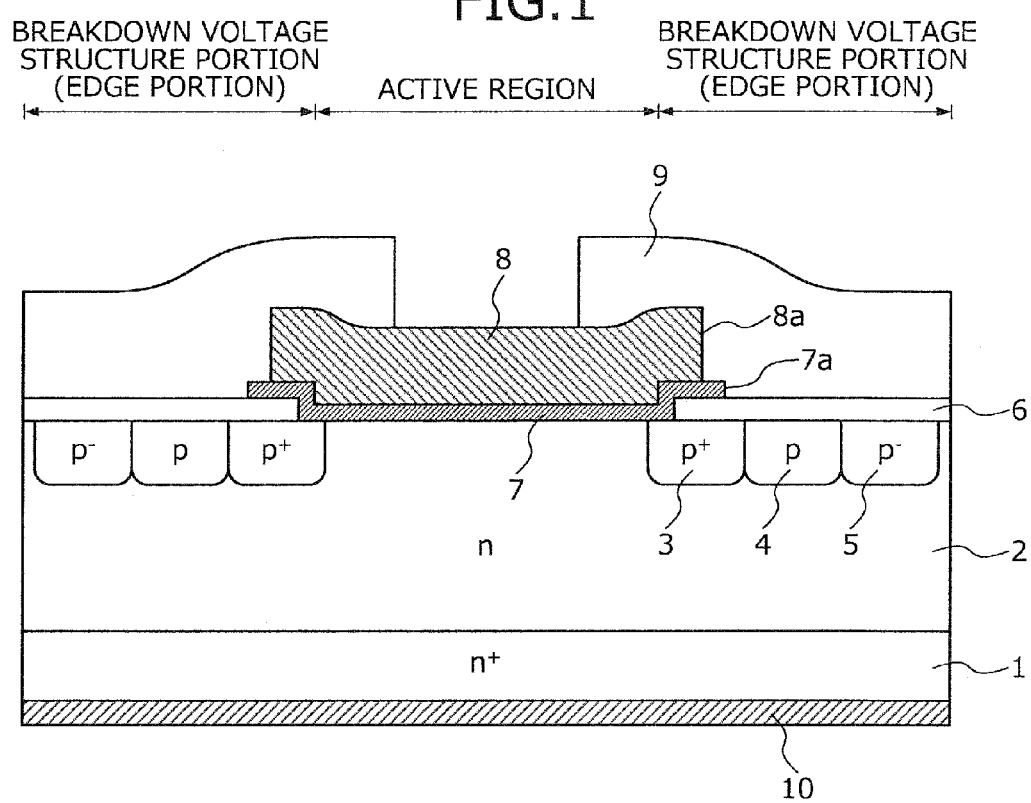
FIG. 1 is a cross-sectional view of a silicon carbide semiconductor device according to an embodiment.
Figure 2:
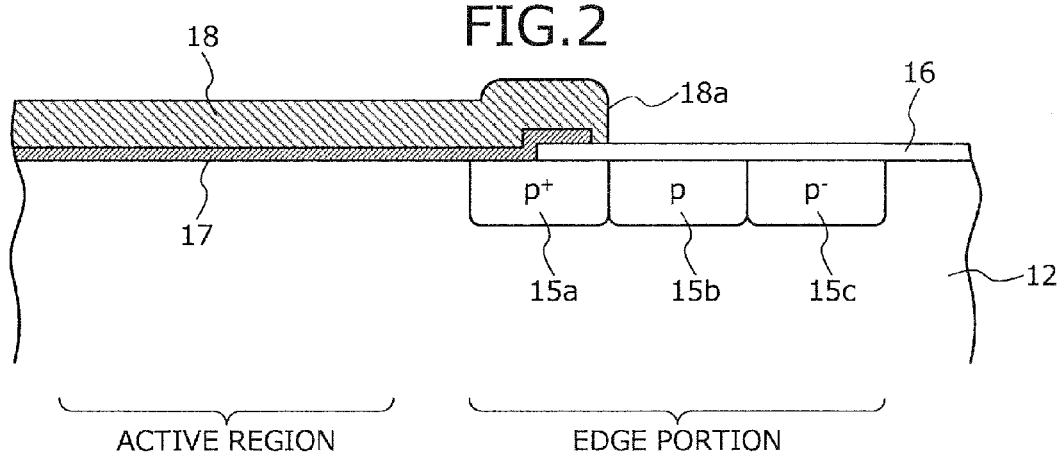
FIG. 2 is a cross-sectional view of a Schottky barrier diode (SBD) of a conventional technique.

A semiconductor device according to the present invention is formed by using a wide band gap semiconductor. In an embodiment, a silicon carbide semiconductor device produced by using, for example, silicon carbide (SiC) as a wide band gap semiconductor will be described by taking a diode in a Schottky junction (Schottky) structure as an example. FIG. 1 is a cross-sectional view of a silicon carbide semiconductor device according to the embodiment. As depicted in FIG. 1, the silicon carbide semiconductor device according to the embodiment has an n-type silicon carbide epitaxial layer (wide band gap semiconductor deposition layer) 2 disposed on a principal plane of an n⁺type silicon carbide substrate (wide band gap semiconductor substrate) 1.

The n⁺ type silicon carbide substrate 1 is a silicon carbide monocrystalline substrate doped with nitrogen (N), for example. The n-type silicon carbide epitaxial layer 2 is a low-concentration n-type drift layer doped with, for example, nitrogen, at an impurity concentration that is lower than the n⁺ type silicon carbide substrate 1. In the following description, a silicon carbide semiconductor base refers to the n⁺ type silicon carbide substrate 1 alone, or refers to the n⁺ type silicon carbide substrate 1 and the n-type silicon carbide epitaxial layer 2, collectively. In a surface layer of the n-type silicon carbide epitaxial layer 2 on the side opposite to the n⁺ type silicon carbide substrate 1 (on the front surface side of the silicon carbide semiconductor base), a ring-shaped P⁺ type region 3 is disposed, and a p-type region 4 and a p⁻ type region 5 are disposed in this order on the outer periphery of the P⁺ type region 3.

The p⁺ type region 3 (first second-conductivity-type semiconductor region) is disposed in a breakdown voltage structure portion (edge portion) disposed in a peripheral portion of the active region to surround an active region. The breakdown voltage structure portion is a region retaining a breakdown voltage. The p⁺ type region 3 is disposed closer to the active region provided with a diode element structure and is in contact with a Schottky electrode 7 forming the Schottky junction with the n-type silicon carbide epitaxial layer 2. The Schottky electrode 7 will be described later.

The p⁺ type region 3 is doped with, for example, aluminum (Al) at a high impurity concentration. The p⁺ type region 3 has a function of avoiding electric field concentration on an end portion of junction between the n-type silicon carbide epitaxial layer 2 and the Schottky electrode 7. The p-type region 4 and the p⁻ type region 5 make up a junction termination extension (JTE) structure further dispersing an electric field in the peripheral portion of the active region. The p-type region 4 and the p⁻ type region 5 are respectively doped with aluminum, for example.

Although not depicted, multiple p⁺ type regions (second-conductivity-type semiconductor regions) may be disposed in the active region at predetermined intervals to make up an element structure of a junction barrier Schottky structure (JBS structure). The p⁺ type regions are disposed separately from the p⁺ type region 3.

An interlayer insulation film 6 is disposed on the breakdown voltage structure portion to cover the P⁺ type region 3, the p-type region 4, and the p⁻ type region 5. The Schottky electrode 7 making up an anode electrode is disposed on a surface of the n-type silicon carbide epitaxial layer 2 on the side opposite to the n⁺ type silicon carbide substrate 1 (on the front surface of the silicon carbide semiconductor base). The Schottky electrode 7 is disposed across the active region and a portion of the breakdown voltage structure portion.

A back surface electrode (ohmic electrode) 10 forming ohmic junction with the n⁺ type silicon carbide substrate 1 is disposed on a surface of the n⁺ type silicon carbide substrate 1 on the side opposite to the n-type silicon carbide epitaxial layer 2 (on the back surface of the silicon carbide semiconductor base). The back surface electrode 10 makes up a cathode electrode.

For example, the Schottky electrode 7 covers the entire surface of the n-type silicon carbide epitaxial layer 2 (the front surface of the silicon carbide semiconductor base) exposed in the active region and comes into contact with the p⁺ type region 3 in the peripheral portion of the active region. The Schottky electrode 7 is disposed to extend from the active region to the breakdown voltage structure portion and overhangs the interlayer insulation film 6. The Schottky electrode 7 covers the p⁺ type region 3 via the interlayer insulation film 6. Therefore, an end portion 7a of the Schottky electrode 7 most extended into the breakdown voltage structure portion is terminated on the p⁺ type region 3 for the JTE structure.

The Schottky electrode 7 is preferably made of the following materials because the effects of the present invention notably appear. The Schottky electrode 7 is preferably made of a group IVa metal, group Va metal, group VIa metal, aluminum, or silicon. Alternatively, the Schottky electrode 7 is preferably made of a composite film having two or three elements of the group IVa metal, group Va metal, group VIa metal, aluminum, and silicon. Particularly, the Schottky electrode 7 is made of titanium (Ti), aluminum, or silicon, or is preferably a composite film having two or three elements among titanium, aluminum, and silicon. More preferably, in the Schottky electrode 7, a portion forming the Schottky junction with the n-type silicon carbide epitaxial layer 2 is made of titanium (Ti), for example.

If the silicon carbide semiconductor device according to the embodiment is used as a high-voltage semiconductor device, the Schottky barrier height of the Schottky electrode 7 and the n-type silicon carbide epitaxial layer 2 is preferably greater than or equal to 1 eV, for example. If the silicon carbide semiconductor device according to the embodiment is used as a power source device, the Schottky barrier height of the Schottky electrode 7 is preferably greater than or equal to 0.5 eV and less than 1 eV, for example.

For example, an electrode pad 8 made of aluminum is disposed on the Schottky electrode 7. The electrode pad 8 is extended from the active region to the breakdown voltage structure portion, and an end portion 8a thereof most extended into the breakdown voltage structure portion is terminated on the Schottky electrode 7. The end portion 8a is positioned closer to the active region as compared to the end portion 7a of the Schottky electrode 7. Therefore, the end portion 7a of the Schottky electrode 7 is located outside with respect to the end portion 8a of the electrode pad 8 so that a portion thereof is exposed.

A protection film 9 such as a passivation film made of, for example, polyimide, is disposed on the JTE structure to cover the end portions of the Schottky electrode 7 and the electrode pad 8 most extended into the breakdown voltage structure portion. The protection film 9 has a function of discharge prevention.

The Schottky electrode 7 and the electrode pad 8 of the configuration described above are fabricated according to the procedure of the following steps 1 to 6:
1. deposition of Ti by sputtering;
2. resist patterning through resist application and photolithography;
3. wet etching of Ti with ammonia hydrogen peroxide water to form the Schottky electrode 7;
4. deposition of Al—Si by sputtering;
5. resist patterning through resist application and photolithography; and
6. wet etching of Al—Si with phosphoric/nitric/acetic-acid mixture liquid to cover the Schottky electrode 7. In this case, Ti is not wet-etched by the mixture liquid. Subsequently, to remove remaining Si (called nodules), dry etching (particle etching) is performed by using carbon tetrafluoride and oxygen as source gas to form the electrode pad 8.

The Schottky electrode 7 is about 0.2 μm thick and, according to the fabrication method, when the exposed Schottky electrode 7 is wet-etched, a side-etching amount (etching amount in the width direction) relative to the end portion 7a is as small as 0.5 to 1 μm. Therefore, the width of the p⁺ type region 3 can be reduced to about 5 μm. As described above, even if the width of the p⁺ type region 3 is reduced, the end portion 7a of the Schottky electrode 7 can be positioned within the p⁺ type region 3.

According to the configuration, since the width of the p$^+$ type region 3 can be made smaller, the size (width) of the breakdown voltage structure portion (edge portion) can be made smaller and the size (width) of the active region can be made relatively larger. For example, although the p$^+$ type region 3 conventionally requires a width of 20 μm, the width can be set to 5 μm in this embodiment.

This difference of 15 μm is generated at one end portion of the active region of FIG. 1, and the width of the active region can be increased by a total of 30 μm, including the other end portion. For example, assuming that an area of the active region is 1 mm$^2$ in the conventional case, the area can be 1.06 mm$^2$ in this embodiment. As described above, since the active region can be made larger, current capacity can be increased and positive bias $V_F$ (V) can be reduced. Since the breakdown voltage structure portion has a smaller width, the die size is not increased.

As described above, according to the embodiment, both the Schottky electrode and the electrode pad can be positioned on the p$^+$ type region for the JTE structure. Particularly, since the electrode pad having a predetermined thickness is disposed inside (closer to the active region) with respect to the Schottky electrode and the end portion of the Schottky electrode is exposed from the end portion of the electrode pad, the semiconductor device is easily fabricated. With regard to etching of the end portion of the Schottky electrode, since the Schottky electrode itself is thin, even if the p$^+$ type region has a narrower width, the end portion of the Schottky electrode can be positioned easily within the p$^+$ type region and the semiconductor device is easily fabricated.

The present invention is not limited to the diode element structure described in the embodiment and the same effect can be acquired even from a MOSFET element structure.

INDUSTRIAL APPLICABILITY

As described above, the silicon carbide semiconductor device and the fabrication method of a silicon carbide semiconductor device according to the present invention are useful for a high-voltage semiconductor device used in power conversion equipment and power source devices of various industrial machines.

EXPLANATIONS OF LETTERS OR NUMERALS 1 n$^+$ type silicon carbide substrate
2 n-type silicon carbide epitaxial layer
3 p$^+$ type region
4 p-type region
5 p$^-$ type region
6 interlayer insulation film
7 Schottky electrode
7a end portion of Schottky electrode
8 electrode pad
8a end portion of electrode pad
9 protection film
10 back surface electrode

The invention claimed is:
1. A silicon carbide semiconductor device comprising:
a first-conductivity-type wide band gap semiconductor substrate;
a first-conductivity-type wide band gap semiconductor deposition layer deposited on a surface of the first-conductivity-type wide band gap semiconductor substrate and having an impurity concentration that is lower than that of the first-conductivity-type wide band gap semiconductor substrate;
an element structure configured by a first metal film that forms a Schottky junction with the first-conductivity-type wide band gap semiconductor deposition layer;
a second metal film for an electrode formed on the first metal film;
a first second-conductivity-type semiconductor region having its width of about 5 μm and selectively disposed in a surface layer of the first-conductivity-type wide band gap semiconductor deposition layer on a side opposite to the first-conductivity-type wide band gap semiconductor substrate, to surround a peripheral portion of the element structure;
a second second-conductivity-type semiconductor region surrounding a peripheral portion of the first second-conductivity-type semiconductor region, to make up a junction termination structure; and
an insulation film that covers at least the second second-conductivity-type semiconductor region, and is disposed from a side of the second second-conductivity-type semiconductor region to a portion of a surface of the first second-conductivity-type semiconductor region, wherein
end portions of the first metal film and the second metal film are positioned on the first second-conductivity-type semiconductor region and within the width of about 5 μm of the first second-conductivity-type semiconductor region, with the end portion of the first metal film exposed on the insulation film, and
the end portion of the second metal film is positioned closer to the element structure as compared to the end portion of the first metal film.

2. A fabrication method of a silicon carbide semiconductor device, the fabrication method comprising:
depositing on a surface of a first-conductivity-type wide band gap semiconductor substrate, a first-conductivity-type wide band gap semiconductor deposition layer having an impurity concentration that is lower than that of the first-conductivity-type wide band gap semiconductor substrate;
forming an element structure by forming a first metal film that forms a Schottky junction with the first-conductivity-type wide band gap semiconductor deposition layer;
forming a second metal film for an electrode on the first metal film;
selectively forming a first second-conductivity-type semiconductor region having its width of about 5 μm and in a surface layer of the first-conductivity-type wide band gap semiconductor deposition layer, to surround a peripheral portion of the element structure;
selectively forming in a surface layer of the first-conductivity-type wide band gap semiconductor deposition layer, a second second-conductivity-type semiconductor region having an impurity concentration that is lower than that of the first second-conductivity-type semiconductor region, the second second-conductivity-type semiconductor region formed to surround a peripheral portion of the first second-conductivity-type semiconductor region and form a junction termination structure;
forming an insulation film to cover at least the second second-conductivity-type semiconductor region, wherein
the insulation film is formed from a side of the second second-conductivity-type semiconductor region to a portion of a surface of the first second-conductivity-type semiconductor region, end portions of the first metal film and the second metal film are positioned on the first second-conductivity-type semiconductor region and within the width of about 5 μm of the first second-conductivity-type semiconductor region, with the end portion of the first metal film exposed on the insulation film, and the end portion of the second metal film is positioned closer to the element structure as compared to the end portion of the first metal film.

* * * * *